United States Patent [19]
McMillan et al.

[11] Patent Number: 5,827,999
[45] Date of Patent: *Oct. 27, 1998

[54] HOMOGENEOUS CHIP CARRIER PACKAGE

[75] Inventors: John R. McMillan, SouthLake; William H. Maslakow, Lewisville, both of Tex.

[73] Assignee: Amkor Electronics, Inc., West Chester, Pa.

[ * ] Notice: The term of this patent shall not extend beyond the expiration date of Pat. No. 5,471,017.

[21] Appl. No.: 339,329

[22] Filed: Nov. 14, 1994

Related U.S. Application Data

[63] Continuation-in-part of Ser. No. 250,153, May 26, 1994, Pat. No. 5,471,011.

[51] Int. Cl.$^6$ .................................................. H01L 23/02
[52] U.S. Cl. .................... 174/52.4; 257/704; 257/706; 257/707; 257/787; 257/788; 174/52.2; 361/709; 361/714; 361/718
[58] Field of Search ............................... 24/827, 830, 831, 24/832, 841, 855; 174/52.1, 52.2, 52.3, 52.4; 257/678, 666, 673, 698, 676, 701, 685, 702, 700, 704, 706, 707, 717, 720, 746, 787, 779, 789, 788; 361/600, 709, 714, 718, 719, 736, 743, 772, 773

[56] References Cited

U.S. PATENT DOCUMENTS

| | | | |
|---|---|---|---|
| 3,790,859 | 2/1974 | Schraeder et al. | 317/100 |
| 3,836,825 | 9/1974 | Hall et al. | 317/100 |
| 3,867,759 | 2/1975 | Siefker | 29/628 |
| 4,092,697 | 5/1978 | Spaight | 361/386 |
| 4,195,193 | 3/1980 | Grabbe et al. | 174/52 FP |
| 4,292,647 | 9/1981 | Lee | 257/81 |
| 4,340,900 | 7/1982 | Goronkin | 357/56 |
| 4,507,907 | 4/1985 | Wolfson | 53/478 |
| 4,521,801 | 6/1985 | Kato et al. | 357/71 |
| 4,594,770 | 6/1986 | Butt | 29/588 |
| 4,630,172 | 12/1986 | Stenerson et al. | 361/386 |
| 4,843,695 | 7/1989 | Doe et al. | 29/827 |
| 4,868,349 | 9/1989 | Chia | 174/52.4 |
| 4,878,108 | 10/1989 | Phelps, Jr. et al. | 357/81 |
| 4,887,149 | 12/1989 | Romano' | 357/81 |
| 4,888,459 | 12/1989 | Crane et al. | 174/52.4 |
| 4,894,709 | 1/1990 | Phillips et al. | 357/82 |
| 4,910,583 | 3/1990 | Behr et al. | 357/81 |
| 4,931,852 | 6/1990 | Brown et al. | 357/72 |
| 4,978,638 | 12/1990 | Buller et al. | 437/209 |
| 5,155,579 | 10/1992 | AuYeung | 357/81 |
| 5,194,695 | 3/1993 | Maslakow | 174/52.4 |
| 5,241,133 | 8/1993 | Mullen, III et al. | 174/52.4 |
| 5,254,500 | 10/1993 | AuYeung | 437/214 |
| 5,328,870 | 7/1994 | Marrs | 437/216 |
| 5,355,283 | 10/1994 | Marrs et al. | 361/760 |
| 5,371,404 | 12/1994 | Juskey et al. | 257/659 |
| 5,378,869 | 1/1995 | Marrs et al. | 219/121.71 |

FOREIGN PATENT DOCUMENTS

| | | |
|---|---|---|
| 1576342 | 6/1969 | France . |
| 2511010 | 2/1975 | Germany . |
| 57-194556 | 11/1982 | Japan . |
| 60-127747 | 7/1985 | Japan . |
| 60-198818 | 10/1985 | Japan . |
| 61-114563 | 6/1986 | Japan . |
| 62-81735 | 4/1987 | Japan . |

OTHER PUBLICATIONS

Q.K. Kerjilian & G.C. Phillips, Jr./ *Thermally Enhanced Multi layer Ceramic Substrate Structure*/IBM Corporation / 07/75 / vol. 18, No. 2.
E. Berndlmaier & J.A. Dorler / *Semiconductor Package with Improved Cooling*/ IBM Corporation / 02/78/ vol. 20, No. 2.

*Primary Examiner*—Bot L. Ledynh
*Attorney, Agent, or Firm*—Jenkens & Gilchrist, a Professional Corporation

[57] ABSTRACT

A thermoplastic chip carrier cavity package for one or more semi-conductor integrated circuit chips. A circuit substrate is formed of a suitable thermoplastic such as PPS or LCP. A casing is further formed atop the substrate with the casing being made of the suitable thermoplastic and being chemically fused to a portion of the circuit substrate to create a moisture seal therebetween. An encapsulant for filling the cavity within the casing and a lid may also be utilized to further secure and seal the chip mounted therein from moisture.

22 Claims, 10 Drawing Sheets

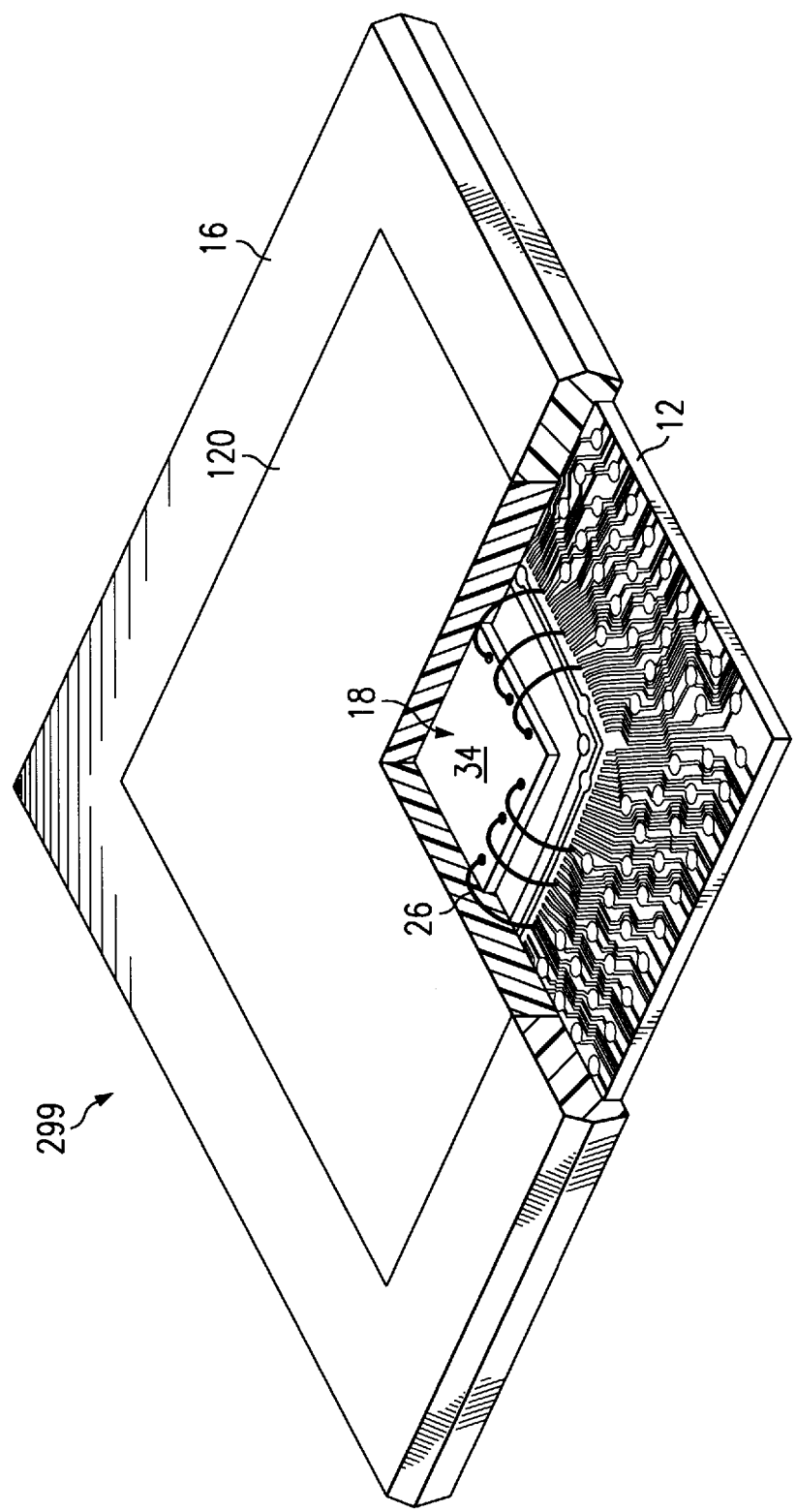

HOMOGENEOUS CHIP CARRIER PACKAGE

This patent application is a continuation-in-part of U.S. patent application Ser. No. 08/250,153 filed May 26, 1994, now U.S. Pat. No. 5,471,011, assigned to the assignee of the present invention.

BACKGROUND OF THE INVENTION

1. Field of the Invention

The present invention relates generally to chip carrier packages for semi-conductor integrated circuit chips and, more particularly, to a homogeneous chip carrier package for semi-conductor integrated circuit chips.

2. Description of Related Art

It is conventional in the electronic industry to encapsulate one or more semi-conductor devices such as integrated circuit chips in chip carrier packages. Chip carrier packages protect a chip or chips from environmental hazards, and provide means for electrically and mechanically attaching the chip to an intended device. A primary focus in the design of a chip carrier package is to provide the chip with adequate protection from the external environment.

One prior art approach for designing a chip carrier package to provide adequate protection from the external environment is the total encasement chip carrier package (TE package). The TE package general includes a lead frame having a chip mounting pad, an integrated circuit chip which is attached to the chip mounting pad, a plurality of fragile wires which connect the chip to the lead frame, and a thermoset plastic which totally encases the lead frame, the chip and the plurality of fragile wires. The TE package has several problems which arise from the thermoset plastic's direct contact with the chip and the plurality of fragile wires. First, the thermoset plastic is in direct contact with the plurality of fragile wires, which connect the chip to the lead frame. The molding process may cause a disruption of the planarity or spacing of the fragile wires, which can produce electrical shorting of the plurality of fragile wires, thus, resulting in chip failure or damage. Second, different coefficients of thermal expansion exist for the chip, the lead frame, the plurality of fragile wires and the thermoset plastic. Materials having different coefficients of thermal expansion expand and contract at different rates during temperature variations. Temperature variations are produced during the molding process of the TE package, during final solder attachment of the TE package to the intended device board and during the operation of the chip within the TE package. The temperature variations provide the possibility for disassociation of the thermoset plastic from the chip and the plurality of fragile wires. Disassociation of the thermoset plastic from the chip and the plurality of fragile wires produces chip failure and/or damage resulting from wire stress failure or wire bond connection failure. The temperature variations further provide the possibility for the formation of voids. Third, the thermoset plastic utilized in the manufacture of the TE package exhibits hygroscopic properties. The hygroscopic properties of the TE package allow moisture to enter and accumulate in the formed voids. High temperatures are required during the final solder attachment of the TE package to the intended device. The high temperatures can convert the moisture, located within the formed voids, into steam, thereby expanding and cracking the TE package or the chip.

Another prior art approach for designing a chip carrier package to provide adequate protection from the external environment is a cavity package. The cavity package generally includes a lead frame having a plurality of lead members and a chip mounting pad, an integrated circuit chip attached to the chip mounting pad, a plurality of fragile wires which connect the chip to the plurality of lead members, a thermoset plastic which is formed around the lead frame and the chip mounting pad in such a manner as to provide a cavity, and a thermoset molded lid which is attached to the cavity by a thermoset adhesive. The cavity package has several problems associated with its manufacture. First, some of the plurality of lead members have their planarity compromised during the process of molding or injecting the thermoset plastic around the lead frame and the chip mounting pad. Each one of the plurality of lead members which has its planarity compromised increases the difficulty in connecting an associated fragile wire from the chip to the compromised lead member. Second, during the molding or injecting process, the chip mounting pad and the plurality of lead members may also be partially, or in some cases, totally, covered with the thermoset plastic material, causing extensive cleaning steps to remove the thermoset plastic material prior to connecting the plurality of fragile wires. Molding apparatus systems have been designed to address certain of these issues. However, the molding apparatus systems are expensive and require costly maintenance. Third, the thermoset plastic which is utilized in the manufacture of the cavity package exhibits hygroscopic properties. The hygroscopic properties of the thermoset plastic allow moisture to enter the cavity. Chemical leaching is produced from the contact of the moisture with the thermoset plastic within the cavity. Leached chemicals, within the cavity, can be in contact with the plurality of fragile wires and/or chip. The leached chemicals can result in the shorting of the plurality of fragile wires, thus, producing chip failure. High temperatures are generated within the cavity during the process of attaching the cavity package to an intended device and during the operation of the chip. The generated high temperatures convert moisture within the cavity to steam, thereby expanding and cracking the thermoset molded lid and/or damage to the chip.

A further approach by the prior art for designing a chip carrier package to provide adequate protection from the external environment is a thermoplastic chip carrier cavity package. A thermoplastic chip carrier cavity package (SC package) generally includes a laminated thermoset circuit substrate having an etched chip mounting pad and a plurality of etched inner lead traces, a lead frame having a plurality of lead members which are soldered to the plurality of etched inner lead traces, an integrated circuit chip attached to the chip mounting pad, a plurality of fragile wires which connect the chip to the plurality of the inner lead traces, a thermoset plastic which is formed around the lead frame, inner lead traces and the chip mounting pad in such a manner as to provide a cavity, and a thermoset molded lid which is attached to the cavity by a thermoset adhesive. The SC package alleviates the planarity problems associated with the cavity package, however, several other problems are present.

First, the thermoset plastic, the thermoset adhesive and the thermoset circuit substrate all exhibit hygroscopic properties which allow moisture to enter the cavity of the SC package and the thermoset circuit substrate. Chemical leaching is produced from the contact of the moisture with the thermoset plastic within the cavity. Leached chemicals, within the cavity, can be in contact with the plurality of fragile wires, the chip and/or the plurality of inner lead traces. The leached chemicals can result in the shorting of the plurality of fragile wires or in the corrosion of the plurality of inner lead traces. The shorting or the corrosion can produce chip failure. High temperatures are generated within the cavity during the process of attaching the SC package to an intended device. The generated high temperatures convert moisture within the cavity and the thermoset circuit substrate to steam. The steam within the cavity expands and may result in the cracking of the thermoset molded lid and/or damage to the chip. The steam within the thermoset circuit substrate may also produce delamination internal to the circuit substrate and/or some of the inner lead traces and chip mounting pad. The delaminated inner lead traces and/or the delaminated chip mounting pad can result in the shorting of the delaminated inner lead traces or the loss of electrical connections between the chip and the lead traces. The shorting of the delaminated inner lead traces and/or the loss of electrical connections produces chip failure. Second, the thermoset plastic, the thermoset adhesive and the thermoset circuit substrate all have different coefficients of thermal expansion. High temperature variations are generated during the process of attaching the SC package to an intended device. The generated high temperature variations result in the loss of mechanical adhesion, between the thermoset plastic and the thermoset circuit substrate, and between the thermoset plastic and the thermoset molded lid. The loss of mechanical adhesion results from the thermoset plastic, the thermoset circuit substrate and the thermoset molded lid all having different coefficients of thermal expansion. The loss of mechanical adhesion between the thermoset molded lid and the thermoset plastic produces a path for moisture to enter the cavity. Moisture within the cavity creates the same chemical leaching, delamination and cracking problems as discussed above with the hygroscopic properties of the SC package.

Other prior art approaches for designing a chip carrier package to provide adequate protection from the external environment include variations to the SC package without a thermoset molded lid. The variation packages utilize a sealant which completely covers the chip, the thermoset circuit substrate and the plurality of fragile wires. Several problems exist, however, for the variation packages. First, the sealant is expensive and adds to the cost of production for the variation packages. Second, some semi-conductor devices, such as microprocessors cannot have direct contact between the chip and the sealant. Improvements in the design of chip carrier packages have thus been necessary to overcome numerous disadvantages of prior art devices.

One prior approach for an improved chip carrier package is set forth as shown in U.S. Pat. No. 5,241,133 assigned to Motorola Inc. This patent teaches a leadless pad array chip carrier package wherein a protective plastic cover is transfer molded about the semiconductor device covering substantially all the top side of a printed circuit board with the bottom side having an array of solder pads which may include solder balls. The leadless pad array chip carrier package comprises a leadless circuit carrying insulating substrate being adapted for the mounting of a semiconductor device on one side thereof. The underside includes a plurality of surface solder pads electrically connected to the semiconductor device by means of vias extending through the leadless circuit carrying substrate. The vias are positioned away from the solder pads. The assembly further includes a protective cover consisting of a resin transfer molded about the semiconductor device. As stated above, such resin coated surfaces are not always acceptable for end users and moisture infiltration is a constant concern with regard to the fabrication of all chip carrier packages. Differentials in the thermal coefficient of expansion between resin coatings and circuit substrates can also be a problem due to the nonhomogeneous material interface therebetween. Any nonhomogeneity can be subject to thermal cracking and comprise an area for moisture infiltration. Chip carrier packages having the advantages of certain prior art devices but constructed of a single homogenous material would therefore be a marked advantage over the prior art.

It would be an advantage therefore to have an improved homogeneous chip carrier package (HC package) for conventional lead frame and land grid array (LGA) and ball grid array (BGA) assemblies. The present invention provides such a package with a chip mounting cavity and electrical contact points disposed on the bottom side of the circuit substrate in LGA and BGA assemblies which utilize the same thermoplastic for the various integral attachments of the HC package. Since the various integral attachments such as a cavity lid are all comprised of the same thermoplastic as the HC package, chemical bonding or fusing of the integral attachments to the HC package may be utilized to provide adequate protection of the chip from the external environment. The HC package eliminates the problems associated with having different coefficients of thermal expansion and reduces the possibility of moisture entering the cavity.

SUMMARY OF THE INVENTION

The present invention relates to a homogeneous thermoplastic chip carrier package for semi-conductor integrated circuit chips. More particularly, one aspect of the present invention includes a circuit substrate formed of a suitable thermoplastic. The circuit substrate includes a region adapted for placement of at least one chip mounting pad and a plurality of lead traces, in association therewith each of which being located so as to provide electrical isolation from each other and the one or more chip mounting pads. Electrical contact points are disposed on the bottom of the circuit substrate and means are provided for connecting the lead traces to the contact points. A casing is further provided which is comprised of the suitable thermoplastic, and covers a portion of the circuit substrate and the connecting means so that a cavity is formed. The casing is chemically fused to a portion of the circuit substrate. Means are also provided for securing the chip in the cavity relative to the circuit substrate.

In yet another aspect, the present invention includes a method of manufacturing a thermoplastic chip carrier cavity package which includes the steps of forming a circuit substrate with a suitable thermoplastic and etching a defined circuit pattern on the circuit substrate. The method further includes the steps of forming a casing, which is comprised of the suitable thermoplastic, to cover the circuit substrate. The casing is chemically bonded to a portion of the base of the circuit substrate. The method also includes the step of securing one or more chips to the circuit substrate and the use of a lid secured thereover.

In yet a further aspect, the present invention comprises a homogeneous thermoplastic ball grid or land grid array cavity package for a semiconductor integrated circuit chip which includes a chip carrier member of integral reinforced laminated thermoplastic substrate material having a plurality of conducting members with inner ends adjacent to at least one integrated circuit chip mounting area. A thermoplastic molding material of same chemical composition, reinforced laminated thermoplastic substrate insulative material is injection molded about the integral reinforced thermoplastic substrate providing a recess or cavity allowing access to at least one circuit chip mounting area and the inner ends of the conducting members adjacent to the circuit chip mounting area. This preferred utilization of same chemical composition, electrical and thermal characteristic thermoplastic material provides a chemical fusing during assembly providing a homogeneous or unitary structure with equivalent moisture and chemical resistance, equivalent electrical and thermal characteristics and equivalent stress management.

BRIEF DESCRIPTION OF THE DRAWINGS

For a more complete understanding of the present invention and for further objects and advantages thereof, reference may now be had to the following description taken in conjunction with accompanying drawings, in which:

FIG. 5 is a fragmentary, cut-away perspective view of an alternative embodiment of the package of FIG. 3;

DETAILED DESCRIPTION

Figure 1:
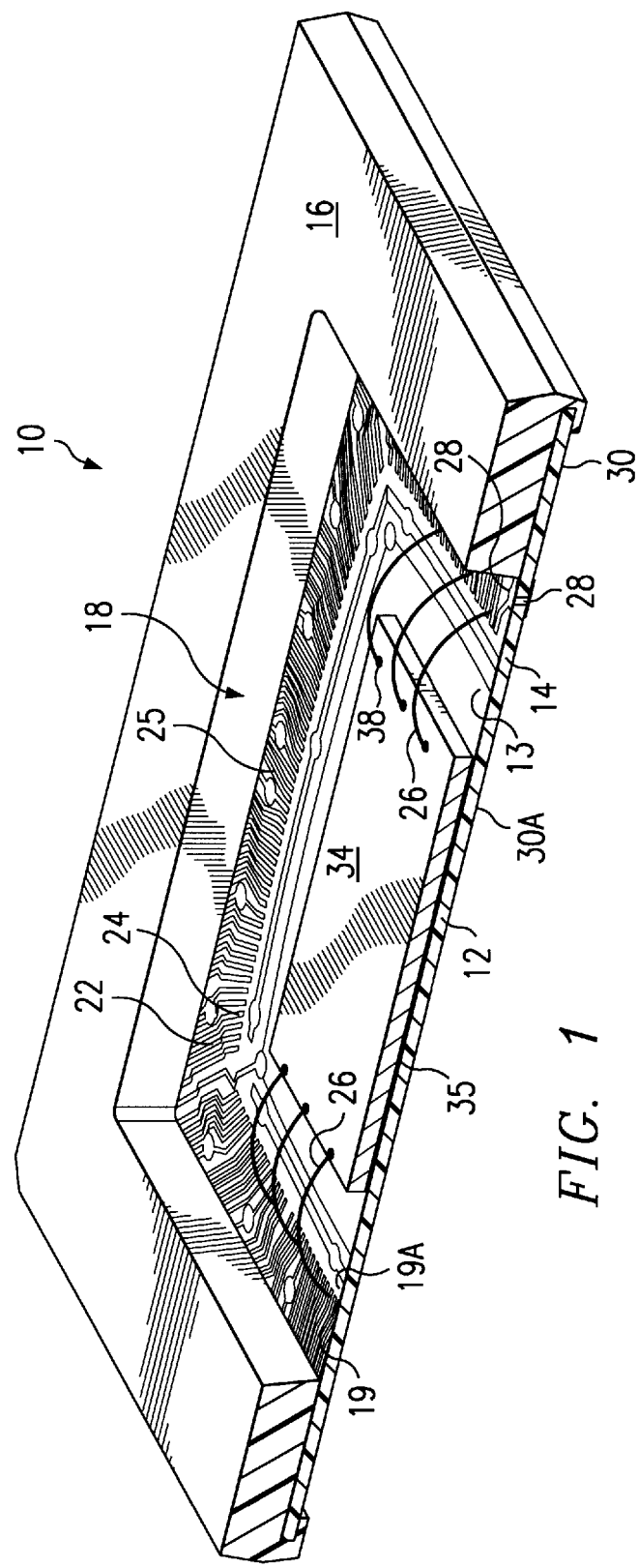
FIG. 1 is a cross-sectional, perspective view of one embodiment of a thermoplastic chip carrier cavity package constructed in accordance with the principles of the present invention.

Referring first to FIG. 1 there is shown a cross-sectional perspective view of one embodiment of a thermoplastic chip carrier cavity package constructed in accordance with the principles of the present invention. The thermal plastic chip carrier cavity package 10 is constructed for receipt of a suitable semiconductor device, herein referred to as a chip or die. The thermoplastic chip carrier cavity package 10 includes a circuit substrate or board 12 formed of a suitable thermoplastic material 14. The circuit substrate 12 includes a region adapted for a placement of a chip mounting pad 13 or the like and a plurality of lead traces (shown below) in association therewith. The lead traces are located so as to provide electrical isolation from each other and the chip mounting pad 13. In this particular configuration, an advancement over the prior art is provided in a configuration adapted for sealing a chip 34 from moisture in a reliable and efficient package. The assembly described herein has these features and is economical to fabricate. After the attachment of the chip 34, a plurality of fragile wires 26 are connected between the plurality of inner lead trace fingers 24 and a plurality of electrical connection pads 38 of the chip 34.

The present invention provides a homogeneous thermoplastic ball grid array cavity semiconductor package constructed of like or similar materials in which the like or similar materials fuse during assembly, providing a homogeneous structure. Polyphenylene sulfide (PPS) or Liquid Crystal Polymer (LCP) may be one of those materials because both have higher temperature limits and provide increased final assembly temperatures which greatly enhance productivity and reduced costs. The use of PPS or LCP herein is preferred but not required. The desired thermoplastic, such as PPS or LCP, also manifests improved moisture resistance properties reducing integral component failure, such as circuit substrate delamination, due to moisture ingress. It is a criteria of reliable package design to also use thermoplastic materials with inherent chemical resistance properties reducing integral component failure due to chemical ingress.

Still referring to FIG. 1, the thermoplastic chip carrier package 10 is presented in a perspective view with portions cutaway for clarity. The package 10 includes the circuit substrate 12 formed of the material 14 and a casing 16 secured thereon to form a cavity or recess 18 therein. The cavity 18 is constructed for receipt and mounting of the appropriate semiconductor device therein as described in more detail below. The term suitable thermoplastic, as used herein, includes LCP or PPS described above or an equivalent.

Referring still to FIG. 1, the manufacture of the chip carrier package 10 is accomplished by first producing a circuit substrate 12. The circuit substrate 12 may comprise a conventional resinous printed circuit board made of suitable thermoplastic such as polyphenylene sulfide (PPS) or liquid crystal polymer (LCP). PPS and LCP are manufactured products of Hoechst Celanese Corporation. The fabrication of such printed circuit boards is a well established technology, and may include multi-layer boards including multiple metallized layers therein. Conventional printed circuit boards have metallization patterns on at least one side and often on opposite sides thereof. Some have plated through holes extending between the metallization patterns on opposite sides of the board. The present invention utilizes metallization patterns formed on one or both sides of the board preferably through a process of either subtractive or additive etching. Plated through holes are generally formed before the etching process. The above referenced etching process can form a multitude of circuits, pads and related elements, including defined circuit pattern 19 on the top side 19A of substrate 12. The pattern 19 includes electrical conductive lead traces 22.

Each one of the plurality of lead traces 22 on top side 19A includes an inner lead trace finger 24, an intermediate trace finger 25 and a plated through hole 28 which extends to a portion of the metallization pattern 30 formed on the bottom side 30A of board 12. The lead traces 22 are formed during the etching process so that electrical isolation is provided between each one of the plurality of lead traces 22 and portions of pattern 30. During the etching process, the chip mounting pad 13 is formed so that electrical isolation is provided between the chip mounting pad 13 and the plurality of lead traces 22. A separate plating procedure is utilized to form plated through holes 28, which procedure is conventional in the printed circuit board industry.

Figure 2:
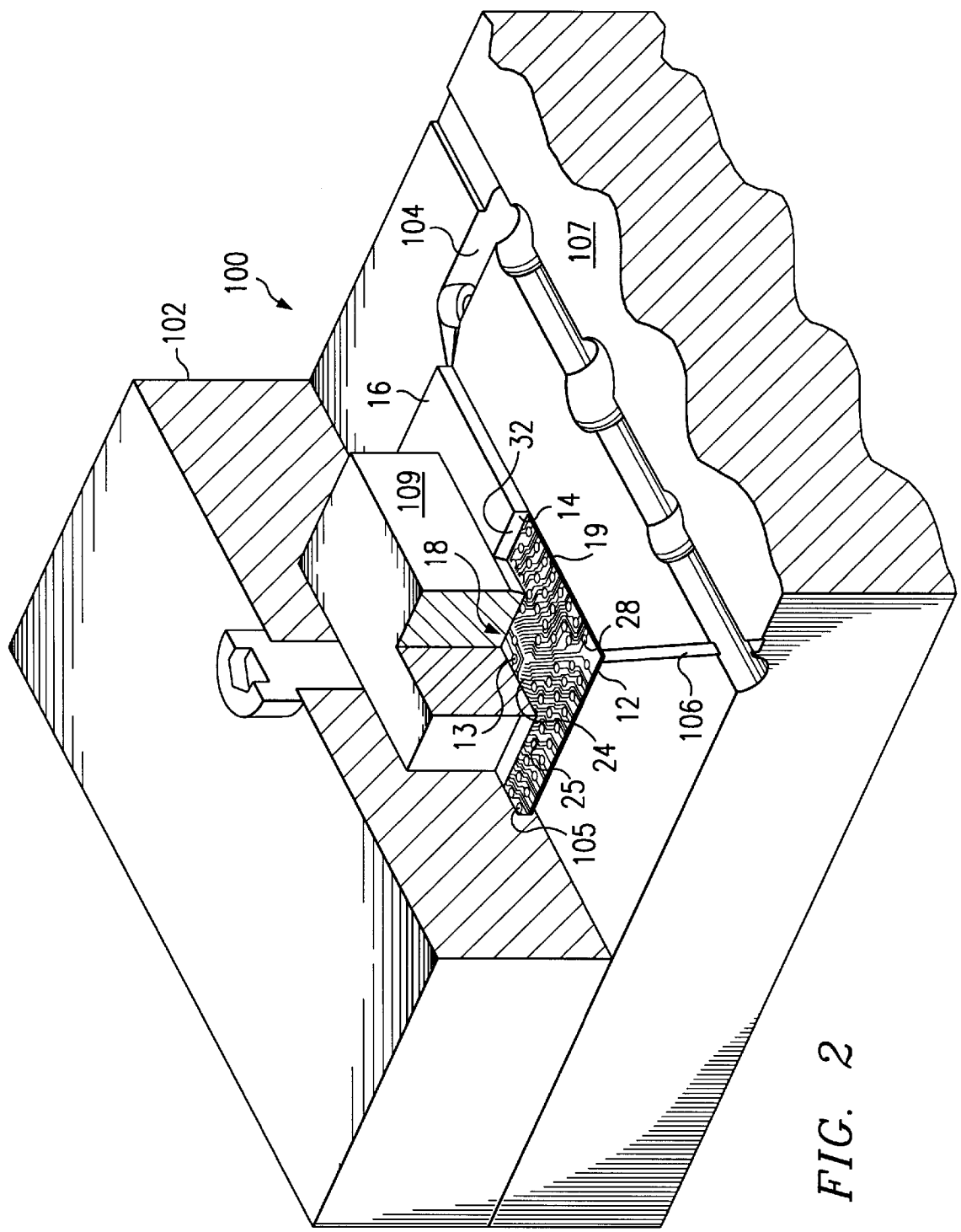
FIG. 2 is a fragmentary, perspective view of a method of and apparatus for molding the carrier package of the present invention.

Referring now to FIG. 2, once the circuit substrate 12 has been fabricated with circuit patterns 19 and 30 (see FIG. 1) and plated through holes 28 connecting said patterns are in place, the substrate 12 is placed within a molding apparatus 100 for forming the casing 16 thereon. The molding apparatus 100 comprises a mold housing 102 specifically designed to form casing 16 as shown and for receiving the suitable thermoplastic 14 onto the circuit substrate 12. The casing 16 is molded in a manner which covers a designated region of the circuit substrate 12, which in FIG. 2 is an outer region. The casing 16 forms the cavity 18 which leaves exposed the chip mounting pad 13, the plurality of inner lead trace fingers 24 and a portion of each one of the plurality of intermediate lead trace portions 25. Cavity 18 includes a plurality of substantially vertical walls 32 upstanding from the substrate 12.

Still referring to FIG. 2, during the above-described molding process, the suitable thermoplastic 14 is in a molten state and is forced through injection ports 104 into mold cavity 105. The mold cavity 105 is defined between fixed mold base 107 and moveable platen 109 which together comprise housing 102. A venting port 106 is also shown in this particular view. The molten state of thermoplastic 14 provides a substantial remelting of the adjacent portion of the top surface 19A of the circuit substrate 12. The remelting of the surface 19A of circuit substrate 12 provides a chemical fusing or bonding of portions of the circuit substrate 12 to the casing 16. The fusion then provides a moisture and chemical barrier equal to that of the suitable thermoplastic 14.

Referring back to FIG. 1, after the molding process of FIG. 2 has been completed, a chip 34 may be attached to the circuit chip mounting pad 13 by utilizing an adhesive material 35. An adhesive curing process as required is applied to the adhesive material 35 which results in an adhesive mechanical attachment of the chip 34 to the chip mounting pad 13. After the attachment of the chip 34, a plurality of fragile wires 26 are connected between the plurality of inner lead trace fingers 24 and a plurality of electrical connection pads 38 of the chip 34.

Referring still to FIG. 1, the thermoplastic chip carrier cavity package 10 of the present invention provides an improved assembly for the electrical and mechanical mounting of a semiconductor device and the protection of said device from the environment. What is not shown in FIG. 1 is the use of a lid or a sealant around the semiconductor device, which techniques will be described below. It may be seen, however, that the fabrication of the casing 16 in conjunction with the substrate 12 will afford improved structural reliability and versatility in the manufacture of the thermoplastic chip carrier cavity package 10. The design affords the manufacturer an opportunity to use the most appropriate encapsulants or other encapsulation techniques within the cavity formed by the casing 16 for a particular end use.

Figure 3:
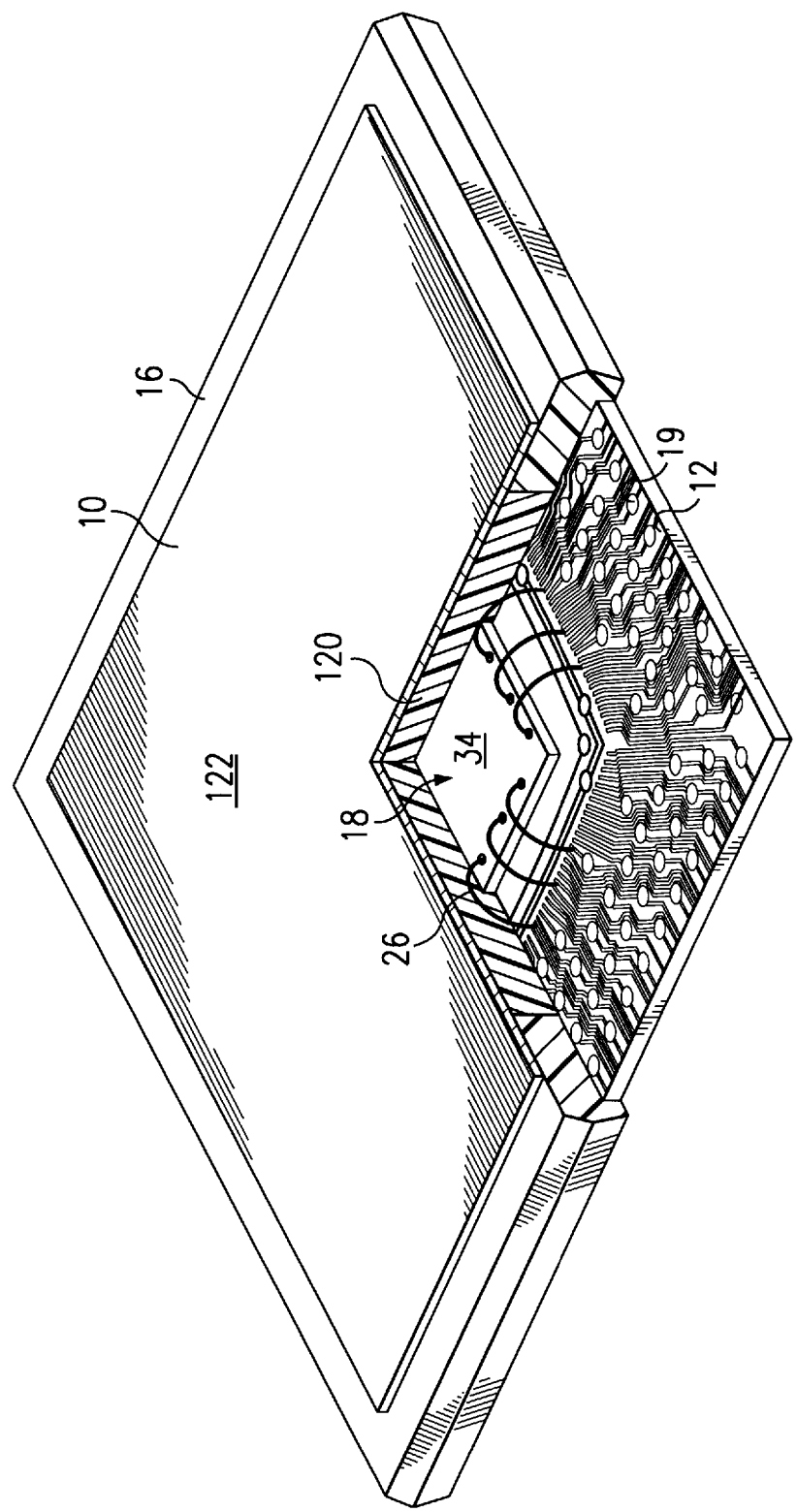
FIG. 3 is an enlarged, fragmentary perspective view of an alternative embodiment of the carrier package of the present invention.

Referring now to FIG. 3, there is shown an alternative embodiment of the package configurations for the carrier package 10 of FIG. 1. FIG. 3 is an enlarged fragmentary perspective of the package of FIG. 1 with an encapsulant 120 filling cavity 18. Portions of the casing 16, substrate 12 and encapsulant 120 are removed for purposes of clarity. In FIG. 3 the casing 16 is disposed upon the substrate 12 around the chip 34 as above described to form a container for the encapsulant 120 which is poured therein covering the chip 34, wires 26 and metallization pattern 19. A lid 122 is disposed over the encapsulant 120 and sealed to the casing 16 as will be described below. The lid may or may not be secured to the encapsulant or casing depending on the application. The following alternative embodiments are also presented for illustrating a variety of packaging approaches in accordance with the principles of the present invention.

Figure 4:
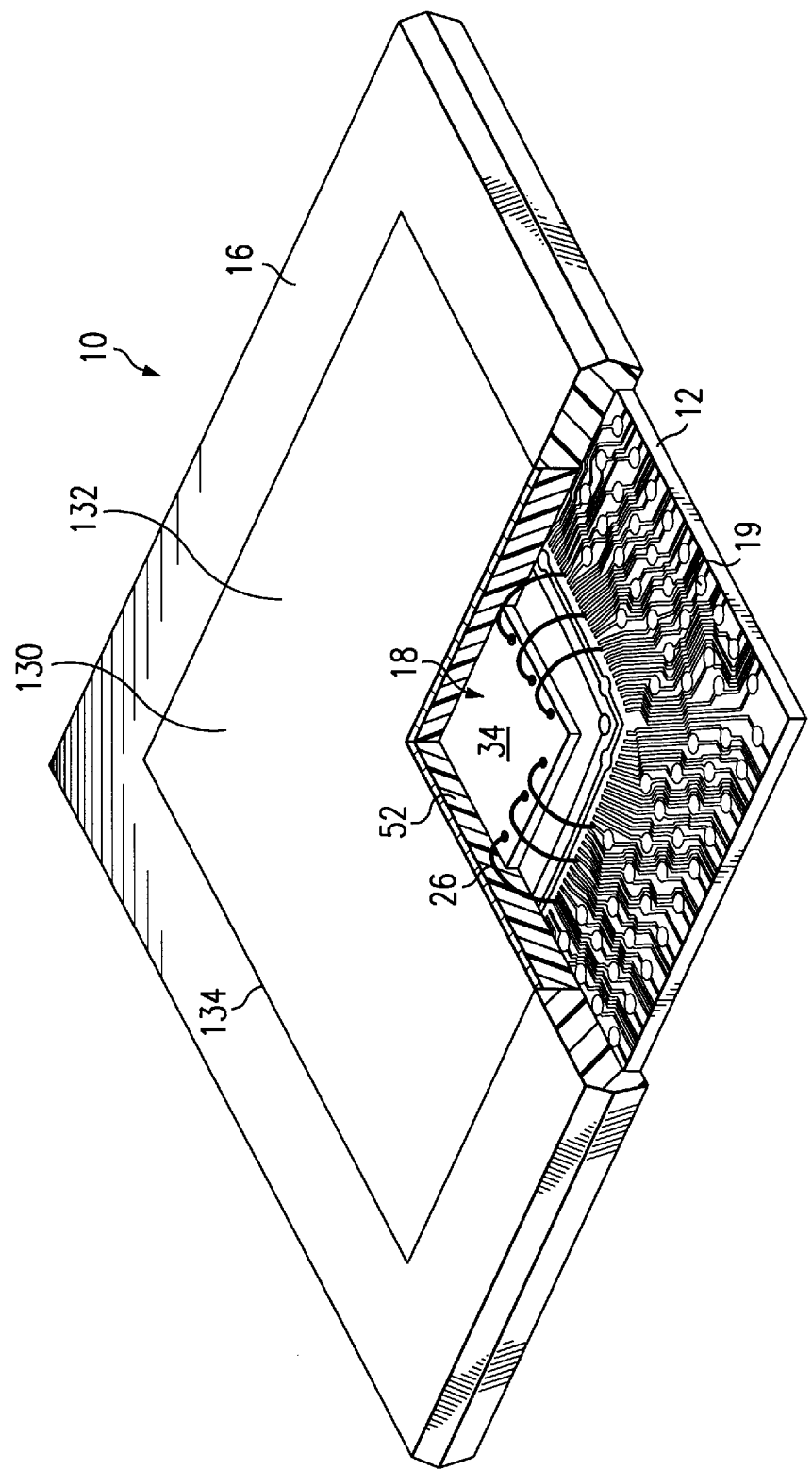
FIG. 4 is a fragmentary, cut-away perspective view of an alternative embodiment of the package of FIG. 3.

Referring now to FIG. 4, there is shown the package 10 of FIG. 1 in a fragmentary cut-away perspective view thereof with chip 34 secured therein and encapsulated in a liquid encapsulant 52, which may be the same as encapsulant 120. The liquid encapsulants may vary in type and include RTV, epoxy and silicone, which are commonly used today as overcoatings and liquid fills. Because of the presence of casing 16 about the circuit substrate 12, a variety of encapsulation techniques may be utilized for protecting the chip 34, wires 26 and pattern 19 in comparison to prior art chip carrier cavity packages. In this particular embodiment, a lid 130 which may be formed of PPS or LCP is recessed within the cavity 18 upon the encapsulant 52 to provide a flush top 132. The lid 130 may be separately formed for placement on the encapsulant 52 and securement thereto by a suitable adhesive, including the encapsulant itself. The lid 130 may also be formed by injection molding the thermoplastic material directly over the encapsulant 52. This molded lid 130 will then fuse to the casing 16 forming a homogeneous surface. Solid lines 134 are provided to diagrammatically illustrate the intersection between the lid 130 and casing 16. The method of bonding is discussed below.

Referring now to FIG. 5, there is shown an alternative embodiment of the encapsulation assembly of FIG. 3 wherein no lid is utilized upon the encapsulant 120. A package 299 is thus provided with a variety of advantageous features. The chip 34 is protected from the environment by the encapsulant 120 fitting the cavity 18 within the casing 16 and further bonded to the substrate 12 over wires 26. A variety of combinations of material and/or bonding techniques may be utilized in accordance with the principles of the present invention as described below.

Figure 6A:
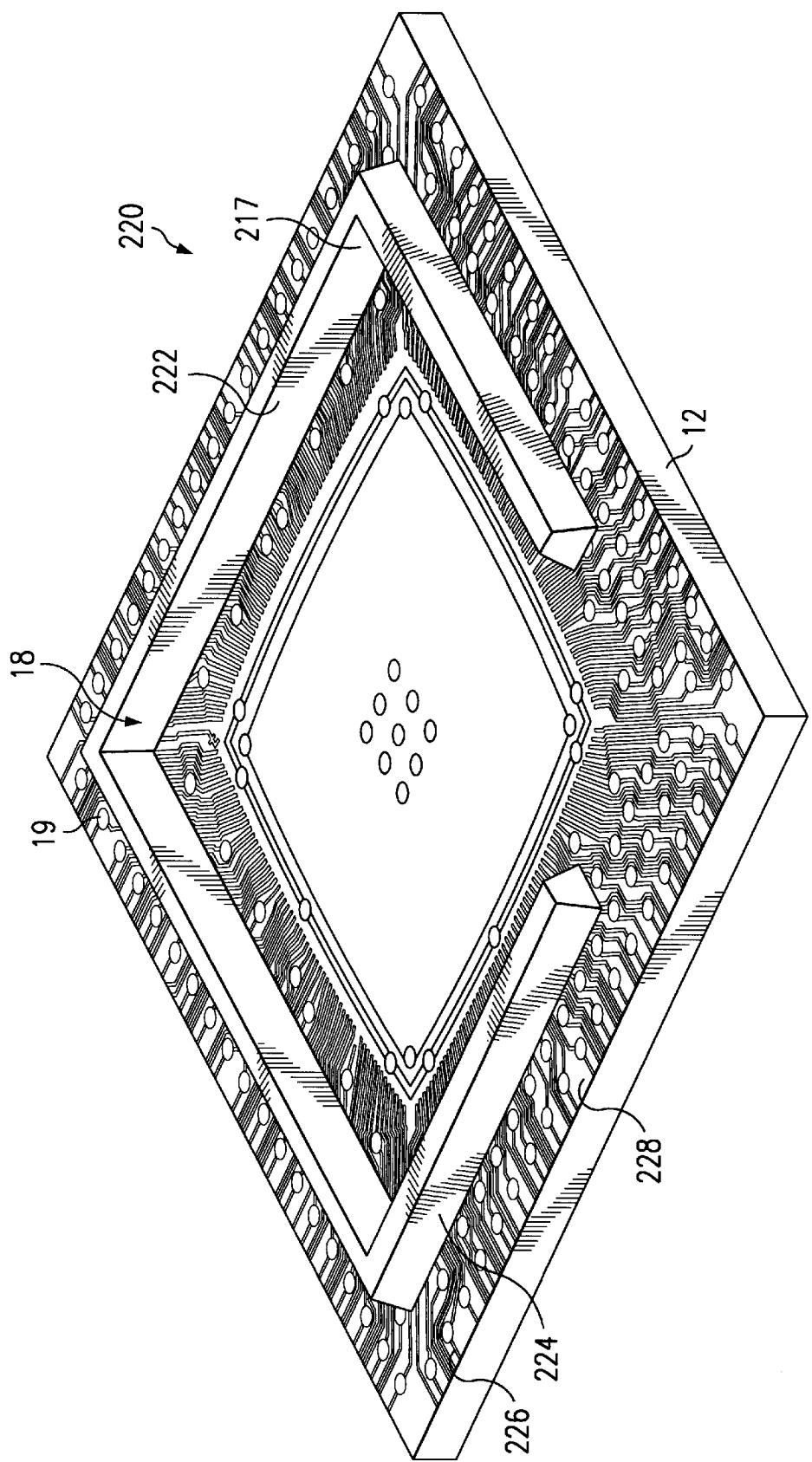
FIG. 6A is a fragmentary, perspective view of an alternative embodiment of the package of FIG. 3.

Referring now to FIG. 6A, there is shown an alternative embodiment of portions of a carrier package constructed in accordance with the principles of the present invention. A segmented casing 217 is secured to the circuit substrate 12 of a chip carrier package 220. The segmented casing 217 is much smaller than the casing 16 of FIG. 1 and covers only a portion of the metallized pattern 19. Inside walls 222 of casing 217 are positioned in approximately the same location as the inside walls of casing 16 of FIG. 1 relative to the substrate 12. The outside walls 224 are recessed inwardly from the perimeter 226 of substrate 12. In this location, outer portions 228 of pattern 19 are exposed after assembly of an encapsulant (not shown) to the package 220. The encapsulant may, as described above, be poured into the cavity 18 and contained by the inside walls 222. One advantage of this particular embodiment is the fact that the package 220 may be strip molded as described below, and the fact that the casing 217 requires less material volume and the associated expense of the thermoplastic casing material. If a thermoplastic material such as PPS is used for the substrate 12 and casing 217, the casing 217 may be chemically fused to the substrate 12 during the injection molding process.

Figure 6B:
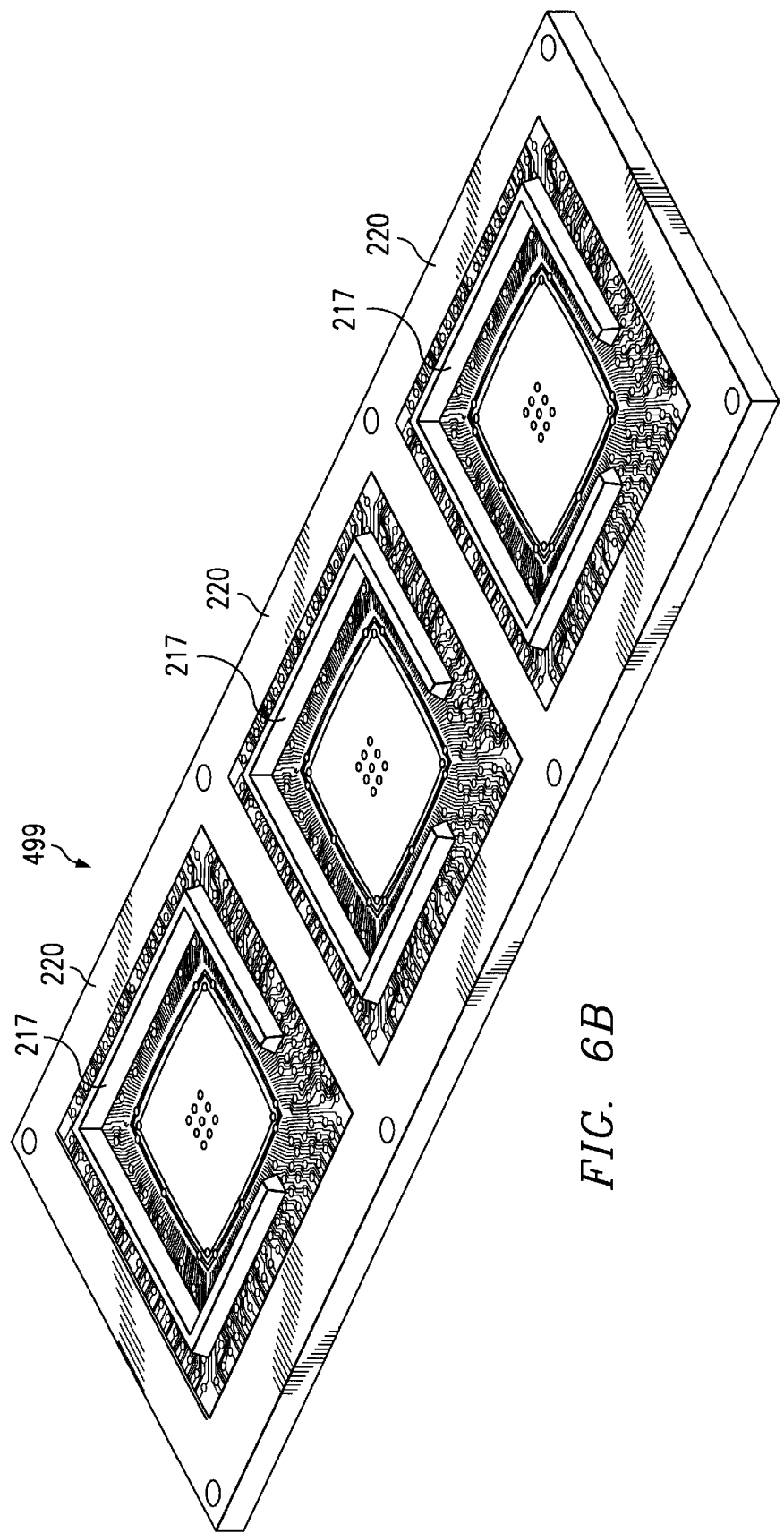
FIG. 6B is a perspective view of a package strip.

Referring now to FIG. 6B there is shown a strip 499 of package 220. Each strip contains two (2) or more circuit substrates to which a segmented casing 217 has been secured as described above. The strip format 499 allows the chip carrier package of the present invention to be processed through the assembly operations of chip attach, wire bond, sealing, and other required operations in a highly productive and automated system. At the end of the assembly operations package 220 will be singulated from the strip to yield an individual chip carrier package. Portions of each casing 217 are cut away for purposes of illustration.

Figure 7:
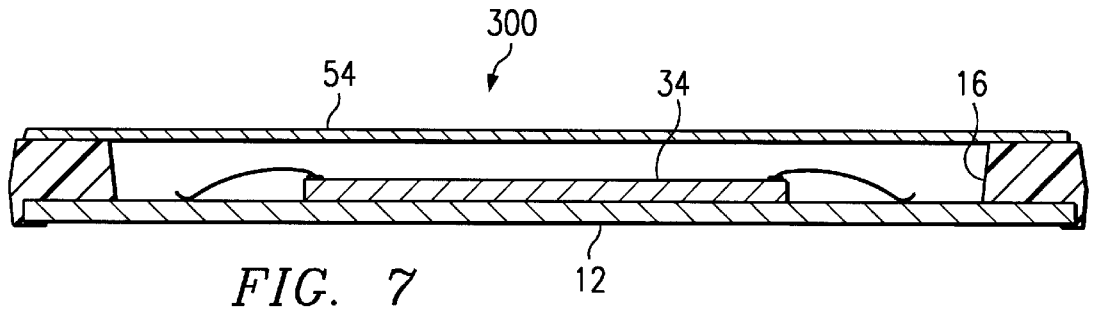
FIG. 7 is a side-elevational, cross-sectional diagrammatic view of an alternative embodiment of the package of FIG. 1.

Referring now to FIG. 7, there is shown a diagrammatic, side-elevational, cross-sectional view of an alternative embodiment of a carrier package constructed in accordance with the principles of the present invention. A chip 34 is secured to the central portion of the substrate 12 to form gas tight lid seal package 300. In this particular embodiment, lid 54 is secured atop the casing 16 in a "gas tight" configuration without the presence of a liquid encapsulant therein. The gas tight lid seal may be provided by a variety of techniques as described below. One of the techniques, in accordance with the principles of the present invention, is to fabricate the lid 54 from the same thermoplastic from which the casing 16 is formed whereby the lid 54 may be chemically fused to the casing 16 by utilizing heat or the like.

Figure 8:
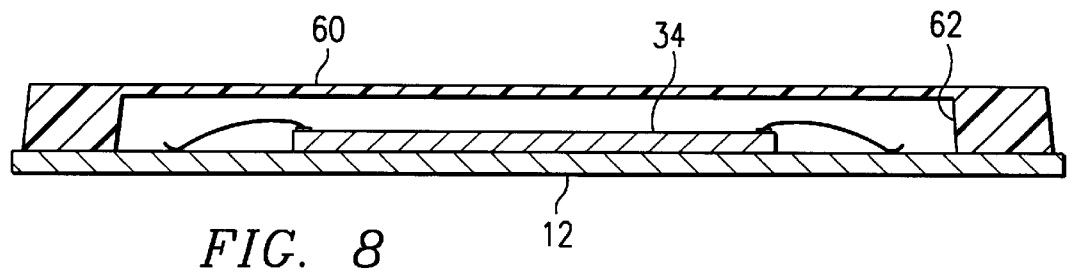
FIG. 8 is a side-elevational, cross-sectional diagrammatic view of an alternative embodiment of the package of FIG. 1.

Referring now to FIG. 8, there is shown yet an alternative embodiment of the securement of a chip 34 to a substrate 12 in accordance with the principles of the present invention. In this particular diagrammatic, side elevational, cross-sectional view, a cup seal lid 60 is provided having side walls 62 of a width substantially equivalent to the width of the side walls of the casing 16 as shown in FIG. 7. By fabricating the cup seal lid 60 from the same thermoplastic material from which the substrate 12 is formed, the bonding of the cup seal lid 60 to the top surface of the substrate 12 may be affected by heat or the like to form a chemical fusion therebetween and provide the advantageous results described above for protecting the chip 34 therein.

Figure 9:
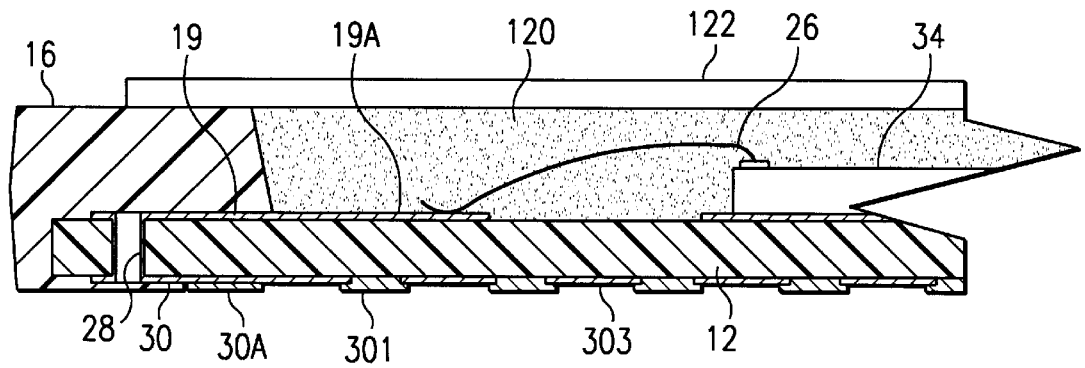
FIG. 9 is an enlarged, side-elevational, cross-sectional view of the package of FIG. 3.

Referring now to FIG. 9, there is shown an enlarged, side elevational, cross sectional view of the casing 16, lid 122 and substrate 12 of the chip carrier cavity package 10 of FIG. 3. In this view it may be seen that the plated through holes 28 establish the electrical connection between the circuit pattern 19 on the top side 19A and the circuit pattern 30 on the bottom side 30A of substrate 12. It may also be seen that by utilizing a common thermoplastic material for the lid 122, casing 16 and substrate 12, the adherence of the casing 16 to the substrate 12 and lid 122 to the casing 16 may effectively eliminate moisture infiltration into a chip 34 mounted thereon.

Referring still to FIG. 9, substrate 12 is fabricated with metallized patterns 19 and 30, first portions of which being electrically connected by plated through holes 28 and second portions of which being covered with a mask 301. A series of land areas 303 are provided for electrical interconnection to the carrier package 10. In this particular view, encapsulant 120 and lid 122 are secured over the chip 34. The encapsulant 120 protects the wires 26 as well as the chip 34. The use of encapsulants may be necessary in certain applications and the present invention provides this optional feature. Thermoplastics are not as reliable as encapsulants because they must be injected under pressure which can move the fragile wires 26. For this reason, the casing 16 forms a cavity into which the proper encapsulant can be introduced to protect wires 26.

Figure 10:
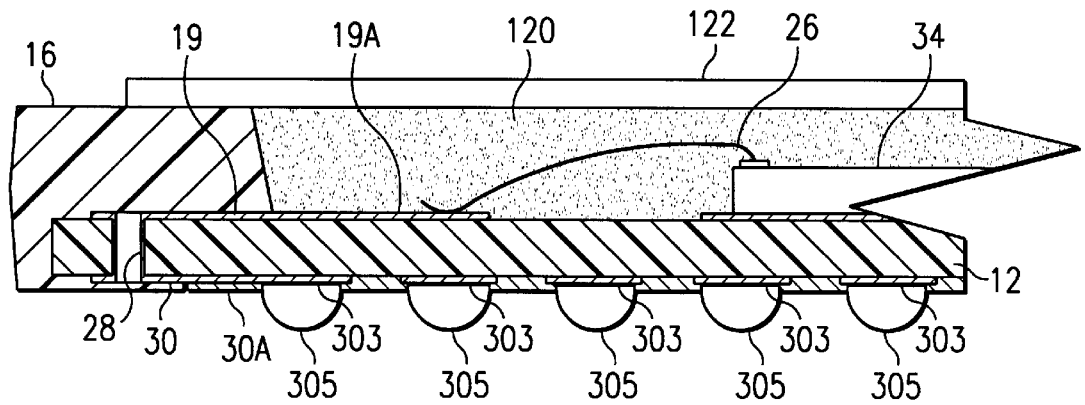
FIG. 10 is an alternative embodiment of the package of FIG. 9.

Referring now to FIG. 10 there is shown an alternative embodiment of the assembly of FIG. 9. The casing 16 surrounding cavity 18 with chip 34 secured therein is further enhanced by a series of solder balls 305 secured to the land areas 303 of substrate 12. Electrical connection to the solder balls 305 is provided from the wires 26 connected to pattern 19 of side 19A, through the plated through hole 28 and across the pattern 30 of side 30A. The land areas 303 are part of pattern 30 and provide a useful electrical connection system.

Referring still to FIG. 10, solder balls 305 afford an easy and reliable interconnection system which is recognized in the integrated circuit chip industry. The use of the lid 122 and casing 16 to create a gas tight seal is an improvement as described herein. A preferable method of securement is fabricating both the casing 16 and lid 122 of the same thermoplastic material and applying sufficient heat for chemical fusion. The use of other adhesives could, however, also be included.

Figure 11:
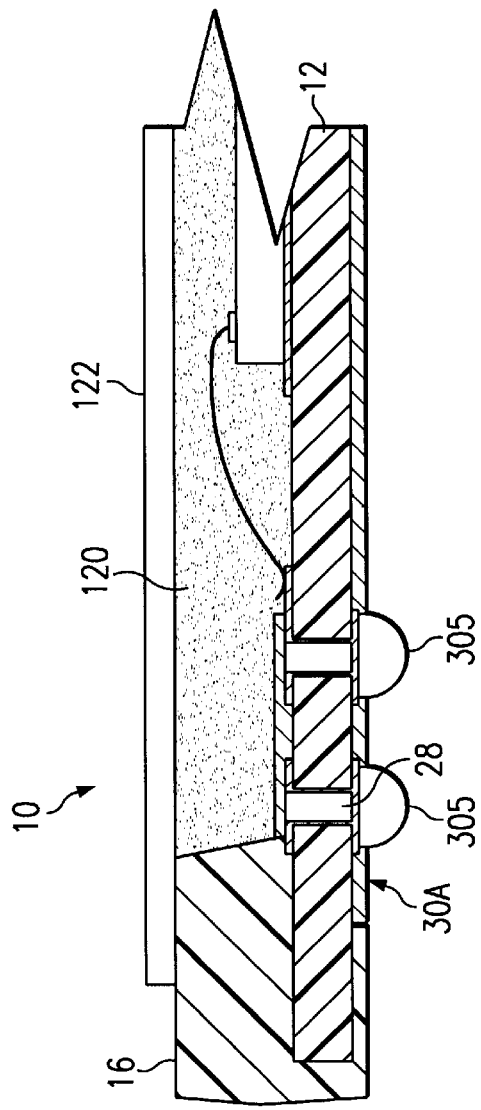
FIG. 11 is an enlarged side-elevational, cross-sectional view of the package of FIG. 3.

Referring now to FIG. 11, there is shown an enlarged side elevational, cross sectional view of the package 10 of FIG. 3 with solder balls 305 depending from surface 30A. The lid 122 extends over encapsulant 120 and is bonded to the top of casing 16. The lid 122 may be bonded as described above. It may be seen in this view that the solder balls 305 are formed over and are attached to the bottom side of several of the plated through apertures 28. All solder balls 305 of this particular illustration are deployed inwardly of casing 16, although this may not always be preferable.

Figure 12:
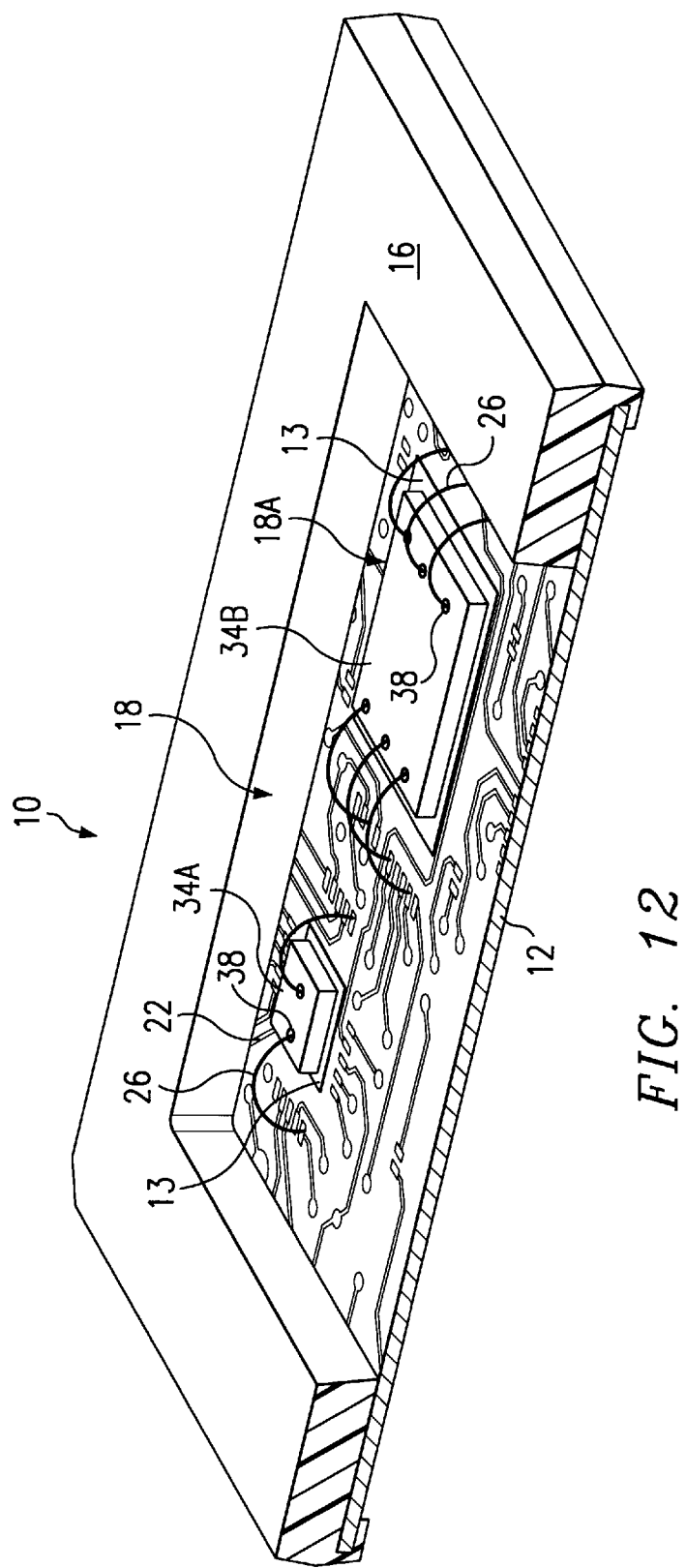
FIG. 12 is a cross-sectional, perspective view of an alternative embodiment of the package of FIG. 1.

Referring now to FIG. 12, there is shown a cross-sectional, perspective view of an alternative embodiment of the package 10 of FIG. 1. The substrate 12 includes a region 18A adapted for placement of chip mounting pads 13, or the like, for two or more chips 34A and 34B. A plurality of lead traces 22 are shown in association therewith. The lead traces 22 are located so as to provide electrical isolation from each other and the chip mounting pads. In this particular configuration, an advancement over the prior art is provided in a configuration adapted for sealing multiple chips from moisture in a reliable and efficient package. The assembly described herein has these features and is economical to fabricate. After the attachment of the chips 34A and 34B in cavity 18 defined within casing 16, a plurality of fragile wires 26 are connected between the plurality of inner lead trace fingers 22 and a plurality of electrical connection pads 38 of the chip 34. The remaining steps of manufacture are as described above.

Figure 13:
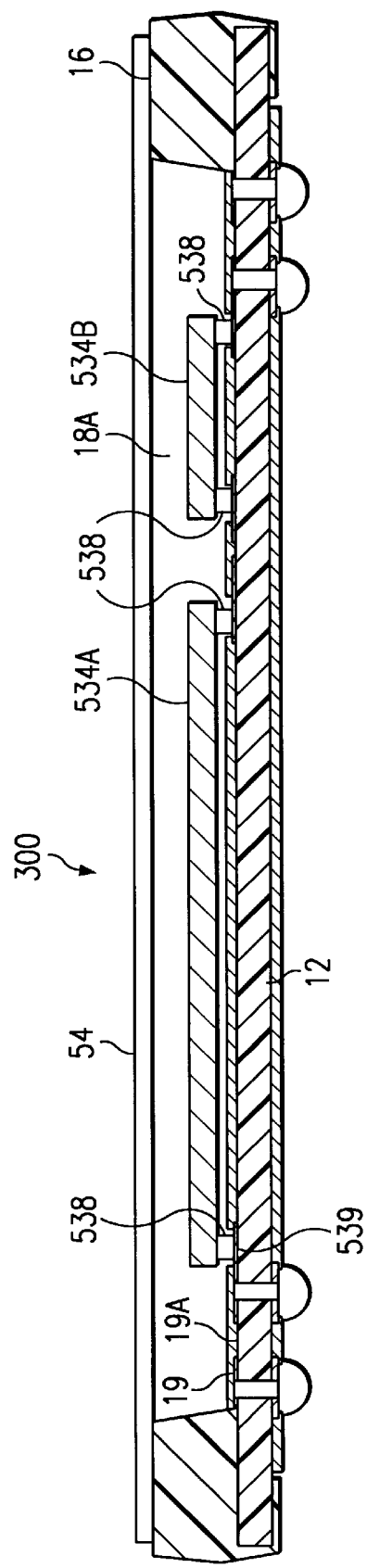
FIG. 13 is a side elevational, cross-sectional view of an alternative embodiment of the package of FIG. 7.

Referring now to FIG. 13 there is shown a side elevational, cross-sectional view of an alternative embodiment of the package 300 of FIG. 7. The substrate 12 includes a region 18A adapted for placement of flip chip mounting pads 13 for flip chips 534A and 534B. Instead of fragile connecting wires, each chip includes a series of electrical connecting pads 538. The pads 538 directly engage connecting points 539 of the circuit pattern 19 on top side 19A of substrate 12. A lid 54 is shown for purposes of illustration. As recited above, a variety of lid types and/or encapsulants may be used in accordance with the principles of the present invention.

Referring now to FIGS. 7–13 in combination, it may be seen that the present invention incorporates a thermoplastic material such as PPS or LCP which forms a homogeneous chip carrier package in a variety of configurations. A wide assortment of encapsulates and lid assemblies may be utilized in accordance with the principles of the present invention. It is preferable in one embodiment to use a common homogeneous material for the fabrication of casing 16 and substrate 12 as well as the lid 54. Other combinations of materials may be used. The lid may, for example, be metal and a specific adhesive may be utilized for bonding the casing 16 to the lid. When a common homogeneous material is utilized, such as PPS, the application of heat will cause a remelting along the surface interface and a chemical fusing to create a seal therebetween that is substantially impervious to moisture infiltration. This is a marked advance over the prior art.

While it is believed that the operation and construction of the system of the present invention will be apparent from the foregoing description, the method of operation and structure of the system shown and described has been characterized as being preferred and obvious changes and modifications may be made therein without departing from the spirit and scope of the invention as defined in the following claims.

What is claimed is:

1. A thermoplastic chip carrier cavity package for an integrated circuit chip, said cavity package comprising:

a circuit substrate formed of a suitable thermoplastic material selected from the group consisting of liquid crystal polymer and polyphenylene sulfide and including a plurality of metallized lead traces formed on a top side thereof and a plurality of metallized electrical contact points formed on a bottom side thereof;

means for mounting at least one chip onto said substrate;

means for connecting said metallized lead traces on said top side to said metallized electrical contact points on said bottom side of said circuit substrate; and a casing comprised of said suitable thermoplastic and covering a portion of said circuit substrate and said connecting means so that a cavity is formed around said chip mounting means, said casing being chemically fused to a portion of said circuit substrate around said chip mounting means.

2. The cavity package of claim 1 and further including a lid adapted for placement over and securement to said casing.

3. The cavity package of claim 2 wherein said lid is formed of said suitable thermoplastic material and is chemically fused to said casing.

4. The cavity package of claim 2 wherein said lid is formed of metal and is secured to said casing by an adhesive.

5. The cavity package of claim 2 wherein said lid is secured to said casing by an adhesive in the form of polyphenylene sulfide.

6. The cavity package of claim 1 wherein said connecting means comprises plated through holes formed in said circuit substrate.

7. The cavity package of claim 1 and further including a liquid encapsulant disposed within said casing, said liquid encapsulant being an epoxy.

8. The cavity package of claim 7 and further including a lid adapted for placement over and securement to said casing.

9. The cavity package of claim 8 wherein said lid is secured to said casing with said encapsulant.

10. The cavity package of claim 8 wherein said lid is secured to said casing with an adhesive.

11. The cavity package of claim 8 wherein said lid is molded onto said encapsulant and fused to said casing.

12. The cavity package of claim 8 wherein said lid is formed of metal.

13. The cavity package of claim 8 wherein said lid is formed of said suitable thermoplastic material and is chemically fused thereto.

14. The cavity package of claim 1 and further including solder balls attached to said metallized electrical contact points on said bottom of said circuit substrate.

15. A thermoplastic chip carrier cavity package for an integrated circuit chip, said cavity package comprising:

a circuit substrate which is formed with a suitable thermoplastic selected from the group consisting of liquid crystal polymer and polyphenylene sulfide and including a plurality of lead traces disposed on the top of said circuit substrate and electrical contact points formed on the bottom of said circuit substrate;

means for connecting said plurality of lead traces to said electrical contact points;

a casing, which is comprised of said suitable thermoplastic, said casing covering a portion of said circuit substrate so that a cavity is formed, said casing being chemically fused to a portion of said circuit substrate; and means for securing a chip to said top side of said circuit substrate inwardly of said lead traces.

16. The cavity package of claim 15 and further including a lid adapted for placement over and securement to said casing.

17. The cavity package of claim 16 wherein said lid is formed of said suitable thermoplastic.

18. The cavity package of claim 15 wherein said securing means includes means for mounting at least two chips on said substrate.

19. The cavity package of claim 18 wherein said securing means includes multiple adhesive pads disposed on said substrate.

20. The cavity package of claim 18 wherein said connecting means includes means for mounting a flip chip on said substrate.

21. The cavity package of claim 20 wherein said connecting means includes means for mounting a plurality of flip chips on said substrate.

22. The cavity package of claim 20 wherein said suitable thermoplastic is polyphenylene sulfide.

* * * * *